United States Patent [19]

Hawrylo et al.

[11] 4,095,011
[45] June 13, 1978

[54] ELECTROLUMINESCENT SEMICONDUCTOR DEVICE WITH PASSIVATION LAYER

[75] Inventors: Frank Zygmunt Hawrylo, Trenton; Henry Kressel, Elizabeth, both of N.J.

[73] Assignee: RCA Corp., New York, N.Y.

[21] Appl. No.: 698,482

[22] Filed: Jun. 21, 1976

[51] Int. Cl.² ............................................. B32B 15/04
[52] U.S. Cl. ..................................... 428/469; 428/472;
428/538; 428/539; 428/913; 427/74; 148/171;
357/2; 357/23; 357/52; 357/17
[58] Field of Search ............... 428/538, 913, 539, 469,
428/472; 427/74; 148/171; 357/2, 23, 52, 17

[56] References Cited

U.S. PATENT DOCUMENTS

| | | | |
|---|---|---|---|
| 3,009,834 | 11/1961 | Hanlet | 428/538 X |
| 3,244,559 | 4/1966 | Sivertsen et al. | 428/538 X |
| 3,705,060 | 12/1972 | Stork | 428/913 X |
| 3,872,492 | 3/1975 | Robbins | 357/23 |
| 3,916,073 | 10/1975 | Horowitz et al. | 428/538 X |
| 3,920,882 | 11/1975 | Venkatu | 428/539 |

*Primary Examiner*—P. C. Ives
*Attorney, Agent, or Firm*—H. Christoffersen; Birgit E. Morris; Donald S. Cohen

[57] ABSTRACT

A semiconductor device has a body of a semiconductor material wherein arsenic, As, is a constituent component of the material. A passivation layer of a material selected from the group consisting of arsenic sulfide, $As_2S_3$, arsenic selenide, $As_2Se_3$, and arsenic telluride, $As_2Te_3$, is on surfaces of the body.

4 Claims, 2 Drawing Figures

ELECTROLUMINESCENT SEMICONDUCTOR DEVICE WITH PASSIVATION LAYER

BACKGROUND OF THE INVENTION

The present invention relates to a passivation layer and more particularly a passivation layer for a semiconductor device wherein arsenic is a constituent component of the body of the device.

In the past, passivation layers have been used on the exposed surfaces of semiconductor devices, such as transistors.

It has recently been discovered that passivation layers on electroluminescent semiconductor devices, such as light emitting diodes and lasers have improved the reliability of such devices. Typically in the past, passivatiion layers have been of oxide materials such as silicon dioxide, $SiO_2$.

However, a problem encountered with semiconductor devices of compounds of elements in Groups III and V of the Periodic Table of Elements, hereinafter III-V compounds and particularly electroluminescent devices, is that oxide passivation layers on bodies of III-V compounds, for example a gallium oxide layer on a gallium arsenide body, have proved to be unstable and do not provide the required passivation function. Therefore it would be most desirable, particularly in the III-V semiconductor device field, to have a passivation layer which is stable and protects the device from undesirable ambient conditions. The passivation layer of the present invention solves this problem for III-V semiconductor devices where arsenic, As, is a constituent component of the device's body.

SUMMARY OF THE INVENTION

A passivation layer for semiconductor devices includes a material selected from the group consisting of arsenic sulfide, arsenic selenide and arsenic telluride. The passivation layer is on a semiconductor body having arsenic as a constituent component.

DETAILED DESCRIPTION OF THE INVENTION

Figure 1:
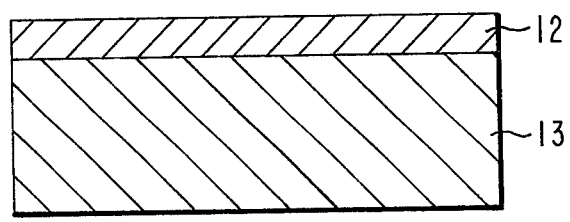
FIG. 1 is a cross-sectional view of a passivation layer of the present invention on a body of semiconductor material.

Referring to FIG. 1, a passivation layer of the present invention is designated as 12. the passivation layer 12 is on a surface of a semiconductor boey 13 which has arsenic, As, as a constituent component. Typically, the body 13 will be of a III-V semiconductor material such as gallium arsenide, gallium aluminum arsenide, or indium arsenide, i.e. seim-conductor material which includes elements from Groups III and V of the Periodic Table of Elements.

The passivation layer 12 is of a material selected from the group consisting of arsenic sulfide, $As_2S_3$, arsenic selenide, $As_2Se_3$, and arsenic telluride, $As_2Te_3$. The passivation layer 12 is partially a native material in the sense that one of the components of the passivation layer 12 is a constituent component of the body 13, i.e. arsenic. Typically, a portion of the arsenic composition of the passivation layer 12 is provided by the body 13. The remaining major portion of the arsenic composition of the layer 12 is provided by a source compound, i.e. arsenic sulfide, arsenic selenide or arsenic telluride, utilized in the fabrication of the passivation layer 12. Also, constituent elements of the body 13 other than arsenic, e.g., gallium if the body 13 is gallium arsenide, may also diffuse into the passivation layer 12 during fabrication, but these other constituent elements will account for only a small portion of the passivation layer's 12 composition.

The passivation layer 12 of the present invention provides the surface of the body 13 with electrical stability by isolating the surface of the body 13 from electrical and chemical conditions in the environment. The passivation qualities of layer 12 will degenerate at a much slower rate than oxide passivation layers, such as silicon dioxide, $SiO_2$, or gallium oxide, $Ga_2O_3$, on the body 13. It is believed that this reduction in degradation is a result of the body 13 providing a portion of the arsenic composition of the passivation layer 12.

Typically, the passivation layer 12 will be at least 1000A in thickness or greater. It is well known in the art that factors determining the electrical resistivity of a passivation layer are the material it is fabricated of and layer's thickness. For the three materials that passivation layer 12 can be formed of, a thickness of at least 1000A is needed to assume that layer 12 will be sufficiently resistive to be an insulator.

In the fabrication of the passivation layer 12 of the present invention, the body 13 of a semiconductor material such as gallium arsenide is placed in a quartz ampoule spaced from a source compound which is selected from the group consisting of arsenic sulfide, arsenic selenide and arsenic telluride. For the purpose of describing the fabrication of the present invention the compound selected is arsenic sulfide. The quartz ampoule is then evacuated, sealed and placed in a diffusion furnace. The ampoule is heated in the diffusion furnace which is set at a temperature of about 640° emitting diode The heated ampoule should have a temperature gradient of at least 5°, so that the ampoule is placed in the diffusion furnance with the arsenic sulfide compound 5°hotter than the body 13. While the ampoule is heated in the diffusion furnance, the arsenic sulfide evaporates and is deposited on the body 13. Also, during this heating step some of the arsenic of the body 13 diffuses to the body surface and reacts with the deposited arsenic sulfide, thereby forming the passivation layer 12 of the present invention. The ampoule and its contents are heated for 4 hours to form a passivation layer 12 of about 5,000A in thickness.

Figure 2:
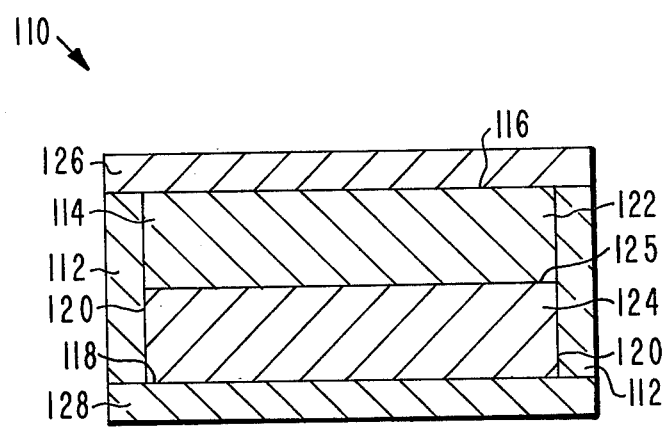
FIG. 2 is a cross-sectional view of a semiconductor device utilizing the passivation layer of the present invention.

FIG. 2 shows the passivation layer of the present invention, which is designated as 112, utilized on a semiconductor device designated as 110. The passivation layer 112 is the same as the passivation layer 12 of FIG. 1. For the purpose of explaining the passivation layer 112 of the present invention, the semiconductor device 110 is described as a light emittingdiode (LED).

The semiconductor device 110 includes a body 114 of a semiconductor material which has a constituent element, arsenic, As. Typically, the body 114 will be of III-V semiconductor materials such as gallium arsenide or gallium aluminum arsenide. The body 114 is capable of generating electroluminescence. The body 114 includes a first surface 116 and a second surface 118 opposite the first surface 116 and four side surfaces 120 which substantially perpendicularly intersect the first and second surfaces 116 and 118. Only two of the side surfaces 120 are shown in the cross-sectional view of FIG. 2. From at least one of the side surfaces, electroluminescence generated within the body 114 is emitted.

The body 114 includes a first layer 122 at the first surface 116, and a second layer 124 at the second surface 118 and contiguous to the first layer 122. The first layer 122 is of one conductivity type and the second layer 124 is of an opposite conductivity type with a PN junction 125 therebetween. For the purpose of describing the present invention the first layer 122 is assumed to be of P type conductivity while the second layer 124 is assumed to be of N type conductivity. The passivation layer 112 is on at least the side surface 120 from which the electroluminescence is emitted, and typically is on all the side surfaces 120. The passivation layer 112 as stated is of a material selected from the group consisting of arsenic sulfide, $As_2S_3$, arsenic selenide, $As_2Se_3$, and arsenic telluride, $As_2Te_3$.

On the first surface 116 is a first electrode 126 making ohmic contact to the first layer 122 and on the second surface 118 is a second electrode 128 making ohmic contact to the second layer 124. Since the passivation layer 112 is an electrical insulator the electrodes 126 and 128 may contact layer 112 without causing a shorting-out of device 10. Both electrodes 126 and 128 may be of a single layer metal such as nickel or tin or they may be multi-layer for example, a first layer of chromium directly on the body 114 with a second layer of gold on the chromium layer.

In the operation of the semiconductor device 110, electroluminescence is generated by the recombination of pairs of oppositely charged carriers.

The passivation layer 112, as stated, is the same as the passivation layer 12 and thus provides the device 110 with electrical stability by isolating the body 114 surfaces from electrical and chemical conditions in the environment. Thereby, the passivation layer 112 provides the device 110 with increased reliability. The passivation layer 112 is of a native material in the sense that one of the components of the passivation layer 112 is a constituent of the body 114, i.e. arsenic.

In the fabrication of the electroluminescent semiconductor device 110 having the passivation layer 112 of the present invention, the body 114 with first and second layers 122 and 124 is formed by liquid phase epitaxy techniques well known in the art, such as those disclosed in U.S. Pat. No. 3,897,281, S. L. Gilbert et al., and U.S. Pat. No. 3,753,801, H. F. Lockwood.

Next, by the method previously described, the passivation layer 112 is formed on the first and second surfaces 116 and 118 and side surfaces 120 of the body 114.

After the passivation layer 112 is formed on the body 114, it is removed from first and second surfaces 116 and 118 by well known etching techniques. Then the first and second electrodes 126 and 128 are formed on the first and second surfaces 116 and 118 of the body 114 by evaporation techniques well known to those in the art, to complete fabrication of the device 110.

While the semiconductor device 110 has been described as an LED, it is anticipated that the passivation layer 112 of the present invention can be used as other semiconductor devices, such as lasers and MOS type devices, where the semiconductor body, on which the passivation layer is to be formed, has arsenic as a constituent component. The device 110 has been shown with a body 114 having two layers. However, the passivation layer 112 can be utilized on a semiconductor device having a plurality of semiconductor layers, as long as the semiconductor material of each layer has arsenic as a constituent component.

The passivation layer of the present invention provides stable electrical isolation for the body surfaces of semiconductor devices.

We claim:

1. An electroluminescent semiconductor device comprising:
   a body of III-V semiconductor material having as a constituent component arsenic, said body having a first surface, a second surface opposite said first surface, side surfaces substantially perpendicular to said first and second surfaces, said body being capable of emitting electroluminescence from at least one of said side surfaces, and
   a passivation layer on at least said emission surfaces, said passivation layer being of a material selected from the group consisting of arsenic sulfide, $As_2S_3$, arsenic selenide, $As_2Se_3$, and arsenic telluride, $As_2Te_3$.

2. The electroluminescent semiconductor device in accordance with claim 1 wherein said arsenic component of said body provides a portion of the arsenic composition of said passivation layer.

3. The electroluminescent semiconductor device in accordance with claim 2 wherein said passivation layer is on all of the side surfaces.

4. The electroluminescent semiconductor device in accordance with claim 3 wherein said body has a plurality of layers.

* * * * *